United States Patent
Hirose et al.

(10) Patent No.: US 10,224,203 B2
(45) Date of Patent: Mar. 5, 2019

(54) METHOD OF PRODUCING SEMICONDUCTOR EPITAXIAL WAFER AND METHOD OF PRODUCING SOLID-STATE IMAGE SENSOR

(71) Applicant: SUMCO CORPORATION, Tokyo (JP)

(72) Inventors: Ryo Hirose, Tokyo (JP); Ryosuke Okuyama, Tokyo (JP); Kazunari Kurita, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 15/538,898

(22) PCT Filed: Nov. 25, 2015

(86) PCT No.: PCT/JP2015/083831
§ 371 (c)(1),
(2) Date: Jun. 22, 2017

(87) PCT Pub. No.: WO2016/104080
PCT Pub. Date: Jun. 30, 2016

(65) Prior Publication Data
US 2017/0352545 A1 Dec. 7, 2017

(30) Foreign Application Priority Data
Dec. 25, 2014 (JP) ................. 2014-262746

(51) Int. Cl.
*H01L 21/265* (2006.01)
*H01L 21/02* (2006.01)
(Continued)

(52) U.S. Cl.
CPC .. *H01L 21/26566* (2013.01); *H01L 21/02005* (2013.01); *H01L 21/0243* (2013.01);
(Continued)

(58) Field of Classification Search
CPC ......... H01L 21/26566; H01L 21/02513; H01L 21/3221; H01L 21/26513; H01L 21/02658;
(Continued)

(56) References Cited

U.S. PATENT DOCUMENTS 5,244,820 A    9/1993   Kamata et al.
7,811,901 B1 * 10/2010  Ong ................. H01L 21/76254
                                                257/E21.568

(Continued)

FOREIGN PATENT DOCUMENTS

CN    101728312 A    6/2010
JP    H03-261060 A   11/1991
(Continued)

OTHER PUBLICATIONS

Korean Office Action issued with respect to Application No. 10-2017-7017353, dated Oct. 27, 2017.
(Continued)

*Primary Examiner* — Su C Kim
(74) *Attorney, Agent, or Firm* — Greenblum & Bernstein, P.L.C.

(57) ABSTRACT

Provided is a method of producing a semiconductor epitaxial wafer having enhanced gettering ability. The method of producing a semiconductor epitaxial wafer includes: a first step of irradiating a surface of a semiconductor wafer with cluster ions to form a modified layer that is located in a surface portion of the semiconductor wafer and that includes a constituent element of the cluster ions in solid solution; and a second step of forming an epitaxial layer on the modified layer of the semiconductor wafer. The first step is performed in a state in which a temperature of the semiconductor wafer is maintained at lower than 25° C.

10 Claims, 3 Drawing Sheets
(2 of 3 Drawing Sheet(s) Filed in Color)

(51) Int. Cl.
*H01L 27/146* (2006.01)
*H01L 21/322* (2006.01)
*H01L 21/324* (2006.01)

(52) U.S. Cl.
CPC .... *H01L 21/0262* (2013.01); *H01L 21/02381* (2013.01); *H01L 21/02447* (2013.01); *H01L 21/02513* (2013.01); *H01L 21/02532* (2013.01); *H01L 21/02658* (2013.01); *H01L 21/26513* (2013.01); *H01L 21/3221* (2013.01); *H01L 27/1464* (2013.01); *H01L 27/14687* (2013.01); *H01L 21/324* (2013.01)

(58) Field of Classification Search
CPC ............. H01L 21/0262; H01L 21/0243; H01L 21/02005; H01L 21/02447; H01L 27/14687; H01L 27/1464; H01L 21/02381; H01L 21/02532; H01L 21/324
See application file for complete search history.

(56) References Cited

U.S. PATENT DOCUMENTS

| | | | |
|---|---|---|---|
| 2002/0004286 A1* | 1/2002 | Atoji | B01D 46/48 438/459 |
| 2010/0090303 A1* | 4/2010 | Takizawa | H01L 21/26506 257/432 |
| 2014/0080247 A1* | 3/2014 | Kadono | H01L 21/02381 438/73 |

FOREIGN PATENT DOCUMENTS

| | | |
|---|---|---|
| JP | H04-141617 A | 5/1992 |
| JP | H04-196416 A | 7/1992 |
| JP | 2014-099478 A | 5/2014 |
| WO | 2012/157162 A1 | 11/2012 |
| WO | 2014/076921 A1 | 5/2014 |
| WO | 2015/104965 A1 | 7/2015 |

OTHER PUBLICATIONS

International Preliminary Report on Patentability dated Jun. 27, 2017 issued in International Patent Application No. PCT/JP2015/083831.
International Search Report (ISR) in International Patent Application No. PCT/JP2015/083831, dated Mar. 8, 2016.
Office Action issued in Taiwan Counterpart Patent Application No. 104142895, dated Jan. 19, 2017, along with an English translation thereof.
Office Action issued in Japanese Counterpart Patent Application No. 2014-262746, dated Nov. 22, 2016, along with an English translation thereof.
Office Action issued in CN 201580070696.8, dated May 2, 2018.
Office Action issued in CN 201580070696.8, dated Oct. 31, 2018, with English translation.

* cited by examiner

METHOD OF PRODUCING SEMICONDUCTOR EPITAXIAL WAFER AND METHOD OF PRODUCING SOLID-STATE IMAGE SENSOR

TECHNICAL FIELD

The present disclosure relates to a method of producing a semiconductor epitaxial wafer and a method of producing a solid-state image sensor.

BACKGROUND

Metal contamination is one of the factors that cause deterioration in semiconductor device characteristics. For example, in the case of a back-illumination solid-state image sensor, metal that is mixed into a semiconductor epitaxial wafer used as a substrate of the image sensor is a factor causing increased dark current in the solid-state image sensor and causing defects referred to as white spot defects. In a back-illumination solid-state image sensor, a wiring layer and the like are provided in a lower layer than a sensor section such that external light can be directly taken in by the sensor, enabling clear images and videos to be recorded even in dark locations. For this reason, back-illumination solid-state image sensors have become widely used in recent years in digital video cameras and mobile telephones such as smart phones. Therefore, it is desirable to reduce white spot defects to as great an extent as possible.

Mixing of a metal into a wafer mainly occurs during a process of producing a semiconductor epitaxial wafer and a process of producing a solid-state image sensor (device production process). Metal contamination in the former process of producing a semiconductor epitaxial wafer may for example occur due to heavy metal particles from constituent materials of an epitaxial growth furnace or heavy metal particles produced through metal corrosion of piping materials as a result of a chlorine-containing gas being used in the furnace during epitaxial growth. The metal contamination described above has been improved to a certain extent in recent years through replacement of the constituent materials of epitaxial growth furnaces with materials having superior corrosion resistance; however, this improvement is still insufficient. On the other hand, in the latter process of producing a solid-state image sensor, heavy metal contamination of a semiconductor substrate is a concern during various processing steps such as ion implantation, diffusion, and oxidizing heat treatment.

One technique for inhibiting heavy metal contamination such as described above involves providing a gettering site in a semiconductor wafer for capturing heavy metals. In a known method using this technique, ions are implanted in a semiconductor wafer and an epitaxial layer is subsequently formed. In this method, a region in which the ions are implanted functions as a gettering site.

PTL 1 describes a semiconductor epitaxial wafer production method including: a first step of irradiating a surface of a semiconductor wafer with cluster ions to form a modified layer that is located in a surface portion of the semiconductor wafer and that includes a constituent element of the cluster ions in solid solution; and a second step of forming an epitaxial layer on the modified layer of the semiconductor wafer.

CITATION LIST

Patent Literature

PTL 1: WO 2012/157162 A1

SUMMARY

Technical Problem

PTL 1 demonstrates that higher gettering ability can be obtained through a modified layer formed by irradiation with cluster ions than through an ion implantation region formed by implantation of monomer ions (single ions). However, there is demand for the provision of semiconductor epitaxial wafers having even higher gettering ability to enable further improvement of semiconductor device characteristics.

In light of the problem described above, an objective of the present disclosure is to provide a method of producing a semiconductor epitaxial wafer having enhanced gettering ability.

Solution to Problem

The inventors reached the following findings as a result of further investigation. Specifically, increasing the dose of cluster ions, for example, is an effective method for enhancing the gettering ability of the modified layer in PTL 1. However, since an excessively large dose leads to the generation of a large number of epitaxial defects in the subsequently formed epitaxial layer, the inventors attempted to find a method that can enhance gettering ability even when a small dose is used. The inventors focused on the temperature of the semiconductor wafer (hereinafter, also referred to as the "substrate temperature") during irradiation with cluster ions. As a result, the inventors discovered that by performing cluster ion irradiation in a state in which the substrate temperature is maintained at lower than room temperature (25° C.), gettering ability in the subsequently obtained semiconductor epitaxial wafer can be enhanced.

The key points of the present disclosure based on the above findings are as follows.

(1) A method of producing a semiconductor epitaxial wafer, comprising:

a first step of irradiating a surface of a semiconductor wafer with cluster ions to form a modified layer that is located in a surface portion of the semiconductor wafer and that includes a constituent element of the cluster ions in solid solution; and a second step of forming an epitaxial layer on the modified layer of the semiconductor wafer, wherein the first step is performed in a state in which a temperature of the semiconductor wafer is maintained at lower than 25° C.

(2) The method of producing a semiconductor epitaxial wafer according to the foregoing (1), wherein the first step is performed in a state in which the temperature of the semiconductor wafer is maintained at no higher than 0° C.

(3) The method of producing a semiconductor epitaxial wafer according to the foregoing (1) or (2), wherein the first step is performed in a state in which the temperature of the semiconductor wafer is maintained at no lower than −200° C.

(4) The method of producing a semiconductor epitaxial wafer according to any one of the foregoing (1) to (3), wherein the first step is performed under conditions such that a portion of the modified layer in terms of a thickness direction becomes an amorphous layer.

(5) The method of producing a semiconductor epitaxial wafer according to the foregoing (4), wherein the first step is performed under conditions such that an average depth of an amorphous layer surface at a semiconductor wafer surface-side of the amorphous layer is at least 20 nm from the surface of the semiconductor wafer.

(6) The method of producing a semiconductor epitaxial wafer according to any one of the foregoing (1) to (5), wherein the cluster ions include carbon as a constituent element.

(7) The method of producing a semiconductor epitaxial wafer according to the foregoing (6), wherein the cluster ions include at least two elements as constituent elements of which one is carbon.

(8) The method of producing a semiconductor epitaxial wafer according to the foregoing (6) or (7), wherein the cluster ions have a carbon number of no greater than 16.

(9) The method of producing a semiconductor epitaxial wafer according to any one of the foregoing (6) to (8), wherein a carbon dose in the first step is $1\times10^{13}$ atoms/cm$^2$ to $5\times10^{15}$ atoms/cm$^2$.

(10) A method of producing a solid-state image sensor, comprising
forming a solid-state image sensor in the epitaxial layer of the semiconductor epitaxial wafer produced by the producing method according to any one of the foregoing (1) to (9).

Advantageous Effect

The method of producing a semiconductor epitaxial wafer according to the present disclosure can provide a semiconductor epitaxial wafer having enhanced gettering ability.

BRIEF DESCRIPTION OF THE DRAWINGS

The patent or application file contains at least one drawing executed in color. Copies of this patent or patent application publication with color drawing(s) will be provided by the Office upon request and payment of the necessary fee. In the accompanying drawings.

DETAILED DESCRIPTION

The following provides a detailed description of embodiments of the present disclosure with reference to the drawings. Note that thicknesses of a modified layer 14, an amorphous layer 16, and an epitaxial layer 18 are exaggerated relative to a semiconductor wafer 10 in FIGS. 1A to 1C in order to facilitate explanation and thus the ratio of thicknesses in FIGS. 1A to 1C differs from the actual ratio.

(Semiconductor Epitaxial Wafer Production Method)

Figure 1:
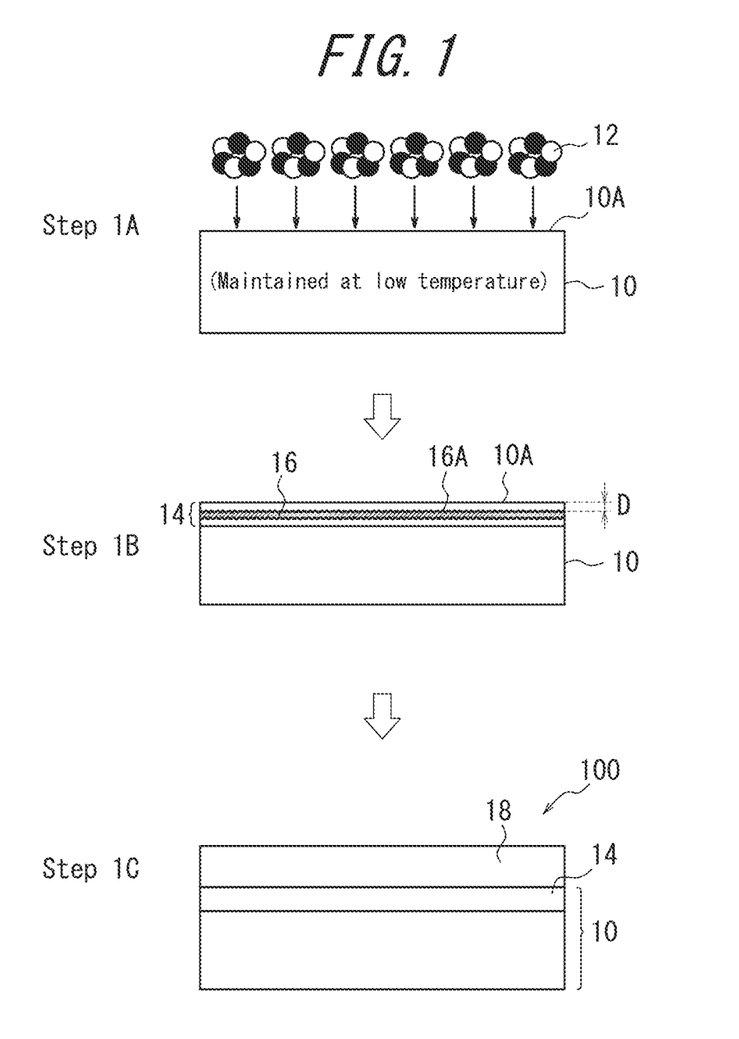
FIGS. 1A, 1B, and 1C are cross-sectional views schematically illustrating a method of producing a semiconductor epitaxial wafer 100 according to an embodiment of the present disclosure.
Figure 2A:
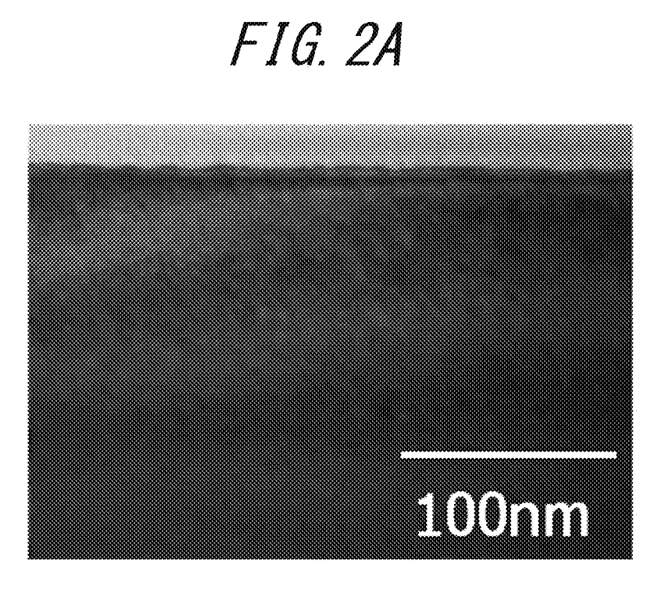
FIG. 2A is a TEM image of a cross-section of a modified layer after the surface of a silicon wafer is irradiated with $C_3H_5$ cluster ions with a carbon dose of $5\times10^{14}$ atoms/cm$^2$ at a substrate temperature of 25° C. (room temperature), but before epitaxial layer formation.
Figure 2B:
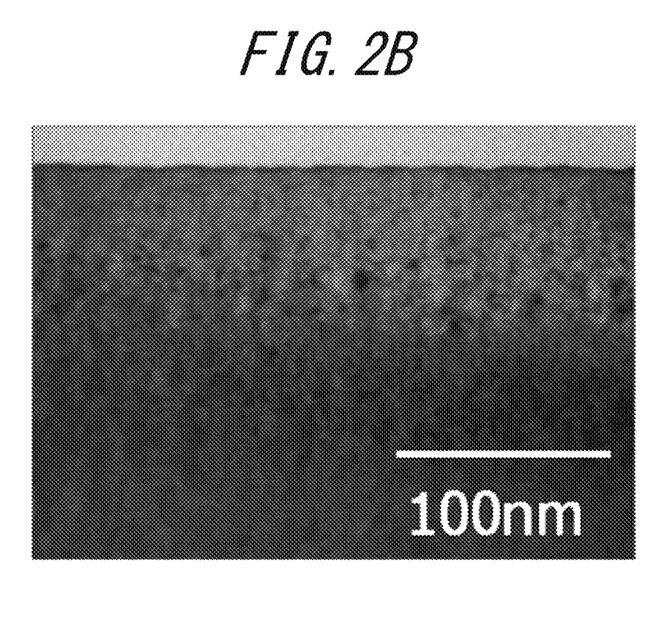
FIG. 2B is a TEM image of a cross-section of a modified layer after the surface of a silicon wafer is irradiated with $C_3H_5$ cluster ions with a carbon dose of $5\times10^{14}$ atoms/cm$^2$ at a substrate temperature of 30° C., but before epitaxial layer formation.

As illustrated in FIGS. 1A to 1C, a production method of a semiconductor epitaxial wafer 100 according to an embodiment of the present disclosure includes: a first step (FIGS. 1A and 1B) of irradiating a surface 10A of a semiconductor wafer 10 with cluster ions 12 to form a modified layer 14 that is located in a surface portion of the semiconductor wafer 10 and that includes a constituent element of the cluster ions 12 in solid solution; and a second step (FIG. 1C) of forming an epitaxial layer 18 on the modified layer 14 of the semiconductor wafer 10. FIG. 1C is a cross-sectional view schematically illustrating the semiconductor epitaxial wafer 100 obtained as a result of this production method. The epitaxial layer 18 forms a device layer for production of a semiconductor element such as a back-illumination solid-state image sensor.

The semiconductor wafer 10 is for example a bulk monocrystalline wafer that is made from silicon or a compound semiconductor (GaAs, GaN, or SiC) and that does not have an epitaxial layer at the surface. In the case of production of a back-illumination solid-state image sensor, the semiconductor wafer 10 is normally a bulk monocrystalline silicon wafer. The semiconductor wafer 10 can for example be obtained by growing a monocrystalline silicon ingot through the Czochralski method (CZ method) or the floating zone melting method (FZ method) and slicing the ingot using a wire saw or the like. Carbon and/or nitrogen may be added to the semiconductor wafer 10 in order to obtain higher gettering ability. Furthermore, a freely selected dopant may be added to the semiconductor wafer 10 in a prescribed concentration to obtain an n+ type, p+ type, n− type, or p− type substrate.

Alternatively, the semiconductor wafer 10 may be an epitaxial semiconductor wafer in which a semiconductor epitaxial layer has been formed on the surface of a bulk semiconductor wafer. For example, the semiconductor wafer 10 may be an epitaxial silicon wafer in which a silicon epitaxial layer has been formed on the surface of a bulk monocrystalline silicon wafer. The silicon epitaxial layer can be formed through CVD under normally used conditions. The thickness of the epitaxial layer is preferably in a range from 0.1 μm to 20 μm and more preferably in a range from 0.2 μm to 10 μm.

Herein, a cluster ion irradiation step illustrated in FIG. 1A is a characteristic step of the present embodiment. Note that the present description uses the term "cluster ion" to refer to an ionized product formed by applying positive charge or negative charge to a cluster of a plurality of atoms or molecules that are assembled into a single mass. The cluster is a lump-shaped group of atoms or molecules (normally from approximately 2 to 2,000) that are bound to one another.

In a situation in which a silicon wafer is irradiated with cluster ions formed, for example, from carbon and hydrogen, upon irradiation of the silicon wafer with the cluster ions 12, the energy of the cluster ions 12 causes the silicon wafer to momentarily reach a high temperature state of approximately 1350° C. to 1400° C. and melts the silicon.

Thereafter, the silicon cools rapidly such that the carbon and hydrogen dissolve in solid solution near the surface of the silicon wafer. In other words, the "modified layer" in the present description is a layer in which constituent elements of the irradiated ions are in solid solution at interstitial positions or substitution positions in the crystal within a surface portion of the semiconductor wafer. The depth direction concentration profile of carbon in the silicon wafer measured by secondary ion mass spectrometry (SIMS) is sharper than in the case of monomer ions and the thickness of a region in which the irradiated carbon is localized (i.e., the modified layer) is roughly no greater than 500 nm (for example, approximately 50 nm to 400 nm). However, note that the concentration profile is dependent on the acceleration voltage and cluster size of the cluster ions. The modified layer 14 functions as a gettering site.

A feature of the present embodiment is that, as illustrated in FIG. 1A, the first step is performed in a state in which the temperature of the semiconductor wafer 10 (substrate temperature) is maintained at lower than 25° C. This enables higher gettering ability to be achieved in the subsequently obtained semiconductor epitaxial wafer 100. Therefore, a back-illumination solid-state image sensor produced from the semiconductor epitaxial wafer 100 that is obtained according to the present embodiment is expected to benefit from suppression of white spot defects. From a viewpoint of achieving this effect to a more satisfactory level, it is preferable that the substrate temperature is maintained at no higher than 0° C. in the first step.

The inventors consider the action by which gettering ability is improved through a lower substrate temperature in the first step to be as follows. When the cluster ions collide with the semiconductor wafer, heat is generated that then heats the surface portion of the semiconductor wafer. The inventors determined that this heating causes the recovery of damage introduced into the surface portion of the semiconductor wafer through irradiation of the cluster ions (self-annealing effect). The inventors presume that maintenance of a low substrate temperature in the first step impairs this self-annealing effect such that the introduced damage does not fully recover, and thus remains as an effective gettering sink.

In the present embodiment, it is not necessary to use a particularly high dose because gettering ability is improved through the low substrate temperature. This is beneficial in terms of making it easier to suppress generation of epitaxial defects.

According to studies carried out by the inventors, when a semiconductor wafer is irradiated with cluster ions, an amorphous region may or may not be formed in the modified layer depending on the irradiation conditions. Moreover, the inventors found that it is possible to obtain higher gettering ability when an amorphous layer is present in a portion of the modified layer in terms of a thickness direction than when an amorphous region is not present in the modified layer. In other words, from a viewpoint of obtaining higher gettering ability, it is preferable that cluster ion irradiation is carried out such that, as illustrated in FIG. 1B, a portion of the modified layer 14 in terms of the thickness direction becomes an amorphous layer 16. Furthermore, studies carried out by the inventors have revealed that a lower substrate temperature in the first step tends to facilitate formation of the amorphous layer 16 after irradiation. In other words, the dose required for formation of the amorphous layer 16 is smaller when the substrate temperature is lower.

As illustrated in FIG. 1B, it is preferable that cluster ion irradiation in the present embodiment is carried out such that the average depth D of a surface 16A of the amorphous layer 16 at a semiconductor wafer surface-side thereof is at least 20 nm and no greater 200 nm from the semiconductor wafer surface 10A, and more preferably at least 20 nm and no greater than 80 nm from the semiconductor wafer surface 10A. This can sufficiently suppress epitaxial defect generation in the subsequently formed epitaxial layer 18.

Although the amorphous layer 16 forms more easily at a lower substrate temperature and a larger dose, an excessively low substrate temperature or an excessively large dose causes thickening of the amorphous layer 16, which may result in the surface of the modified layer 14 also becoming part of the amorphous layer. If the epitaxial layer 18 is grown on the amorphous layer 16, this may lead to the generation of epitaxial defects. In consideration of this, the substrate temperature is preferably maintained at no lower than −200° C. in the first step, and is more preferably maintained at no lower than −120° C. in the first step. This is because if the substrate temperature is lower than −200° C., the amorphous layer 16 may be formed to an excessive degree regardless of the cluster irradiation conditions, and thus it may not be possible to suppress generation of epitaxial defects.

The average thickness of the amorphous layer 16 is preferably no greater than 100 nm and more preferably no greater than 60 nm. An average thickness of greater than 100 nm may make it difficult to select cluster irradiation conditions that ensure the average depth of the surface 16A is at least 20 nm from the semiconductor wafer surface 10A.

Figure 3A:
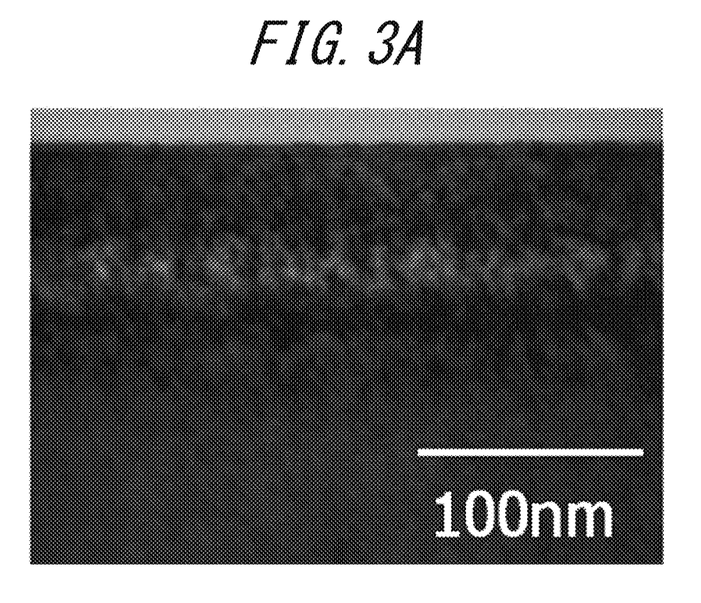
FIG. 3A is a TEM image of a cross-section of a modified layer after the surface of a silicon wafer is irradiated with $C_3H_5$ cluster ions with a carbon dose of $2\times10^{15}$ atoms/cm$^2$ at a substrate temperature of 25° C. (room temperature), but before epitaxial layer formation.
Figure 3B:
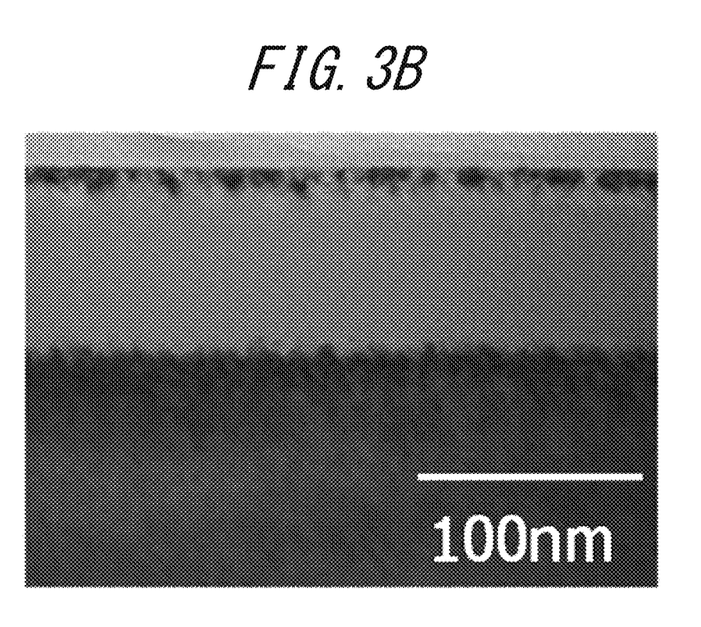
FIG. 3B is a TEM image of a cross-section of a modified layer after the surface of a silicon wafer is irradiated with $C_3H_5$ cluster ions with a carbon dose of $2\times10^{15}$ atoms/cm$^2$ at a substrate temperature of −30° C., but before epitaxial layer formation.

Note that as illustrated in FIG. 1B and also FIG. 3B explained further below, the depth of the amorphous layer surface varies depending on the width direction position. In the present disclosure, the "average depth of the amorphous layer surface at the semiconductor wafer surface-side of the amorphous layer" is defined as the average depth of the surface in a transmission electron microscopy (TEM) image obtained through observation of a cross-section of the amorphous layer using a TEM. The "average depth" is an intermediate depth between a shallowest position and a deepest position of a boundary between the amorphous layer and a crystalline region. The "average thickness of the amorphous layer" is defined as the average thickness of the amorphous layer in a TEM image and, more specifically, the difference between the average depths of two surfaces of the amorphous layer. The magnification of the TEM image should be of a level that enables the amorphous layer to be clearly observed; in the examples illustrated in FIGS. 2A, 2B, 3A, and 3B, the magnification is ×500.000. As illustrated in FIG. 1C, heat in formation of the epitaxial layer 18 after cluster ion irradiation causes recovery of crystallinity of the modified layer 14, and leads to loss of the amorphous layer 16.

The cluster ions may include a variety of clusters depending on the binding mode and can be generated by commonly known methods such as described, for example, in the following documents. Gas cluster beam generation methods are described in (1) JP H9-41138 A and (2) JP H4-354865 A. Ion beam generation methods are described in (1) Charged Particle Beam Engineering, Junzo Ishikawa, ISBN 978-4-339-00734-3, Corona Publishing Co., Ltd.; (2) Electron/Ion Beam Engineering, The Institute of Electrical Engineers of Japan, ISBN 4-88686-217-9, Ohmsha, Ltd.; and (3) Cluster Ion Beam Fundamentals and Applications, ISBN 4-526-05765-7, Nikkan Kogyo Shimbun, Ltd. In general, a Nielsen ion source or a Kaufman ion source is used for generating positively charged cluster ions, whereas a high current negative ion source using volume generation is used for generating negatively charged cluster ions.

The substrate temperature can be lowered by cooling a stage on which the semiconductor wafer is positioned inside a cluster ion irradiation apparatus. Specifically, the stage can be cooled by causing a coolant such as liquid nitrogen or ethylene glycol that is maintained at a constant temperature using a chiller to flow through channels disposed uniformly inside the stage. The substrate temperature can be adjusted by altering the temperature or flow rate of the coolant.

The following describes cluster ion irradiation conditions other than the substrate temperature.

No specific limitations are placed on elements used for irradiation other than being elements that contribute to gettering. Examples of elements that can be used include carbon, boron, phosphorous, and arsenic. However, it is preferable that the cluster ions include carbon as a constituent element from a viewpoint of obtaining higher gettering ability.

The irradiated elements are preferably at least two elements of which one is carbon. In particular, it is preferable that one or more dopant elements selected from the group consisting of boron, phosphorus, arsenic, and antimony are irradiated in addition to carbon. The types of metals that can be effectively gettered differ depending on the types of elements that are in solid solution. Therefore, providing at least two elements in solid solution makes it possible to deal with a wider range of metal contaminants. For example, nickel can be effectively gettered using carbon, whereas copper and iron can be effectively gettered using boron.

No specific limitations are placed on compounds that are ionized. Examples of carbon source compounds that can be ionized include ethane, methane, and carbon dioxide ($CO_2$), whereas examples of boron source compounds that can be ionized include diborane and decaborane ($B_{10}H_{14}$). For example, in a situation in which a mixed gas of dibenzil and decaborane is used as a material gas, hydrogenated compound clusters in which carbon, boron, and hydrogen are aggregated can be produced. Alternatively, in a situation which cyclohexane ($C_6H_{12}$) is used as a material gas, cluster ions formed from carbon and hydrogen can be produced. Clusters $C_nH_m$ ($3 \leq n \leq 16$, $3 \leq m \leq 10$) produced, in particular, from pyrene ($C_{16}H_{10}$), dibenzil ($C_{14}H_{14}$), or the like as a carbon source compound are preferable. The reason for the above is that a beam of small cluster ions can be easily controlled.

The compound that is ionized may preferably be a compound that includes both carbon and the previously mentioned dopant element. When a compound such as described above is irradiated as cluster ions, carbon and the dopant element can both be provided in solid solution through a single irradiation.

The formation or non-formation of an amorphous layer in the modified layer and the average depth of the surface 16A of the amorphous layer 16 when formation does occur are controlled through the substrate temperature, and also the cluster ion dose, cluster size, cluster ion acceleration voltage, beam current, and so forth, and are particularly dependent on the substrate temperature, the dose, and the cluster size. The present description uses the term "cluster size" to refer to the number of atoms or molecules forming a single cluster.

The cluster size can be set as appropriate as from 2 to 100 atoms/molecules, preferably no greater than 60 atoms/molecules, and more preferably no greater than 50 atoms/molecules. In the examples described further below, $C_3H_5$ having a cluster size of 8 was used. The cluster size can for example be adjusted by adjusting the pressure of gas sprayed from a nozzle, the pressure in a vacuum vessel, and the voltage applied to a filament during ionization. Note that the cluster size can be calculated by obtaining a cluster number distribution by mass spectrometry using a quadrupole high frequency electric field or time-of-flight mass spectrometry and taking an average value of the cluster numbers.

The dose of cluster ions can be adjusted by controlling the ion irradiation time. In a situation in which the substrate temperature is room temperature, a carbon dose of roughly at least $1 \times 10^{15}$ atoms/cm$^2$ is required to form the amorphous layer 16 in the modified layer 14, although this dose is also dependent on the cluster size. However, when the substrate temperature is lowered as in the present embodiment, an amorphous layer can be formed with a smaller dose. The carbon dose is preferably $1 \times 10^{13}$ atoms/cm$^2$ to $5 \times 10^{15}$ atoms/cm$^2$, and is more preferably $5 \times 10^{14}$ atoms/cm$^2$ to $2 \times 10^{15}$ atoms/cm$^2$ from a viewpoint of ensuring that the average depth of the surface 16A at the semiconductor wafer surface-side of the amorphous layer 16 is at least 20 nm from the semiconductor wafer surface 10A.

The acceleration voltage of the cluster ions, in combination with the cluster size, influences the position of a peak in the depth direction concentration profile of a constituent element in the modified layer 14 and thus also indirectly influences the depth of the amorphous layer. In a situation in which $C_nH_m$ ($3 \leq n \leq 16$, $3 \leq m \leq 10$) cluster ions are used, the acceleration voltage per one carbon atom is required to be greater than 0 keV/atom and no greater than 50 keV/atom, and preferably no greater than 40 keV/atom, in order that the average depth of the surface 16A at the semiconductor wafer surface-side of the amorphous layer 16 is at least 20 nm from the semiconductor wafer surface 10A.

Adjustment of the acceleration voltage is usually performed by two methods: (1) electrostatic acceleration and (2) high-frequency acceleration. The former method is for example a method in which electrodes are arranged at equal intervals and the same voltage is applied between the electrodes such that a constant accelerating field is formed in an axial direction. The latter method is for example a linac (linear accelerator) method in which ions are caused to travel along a straight line while being accelerated by high frequency waves.

The beam current is required to be roughly at least 100 µA and no greater than 1,000 µA in order that the amorphous layer 16 is formed in the modified layer 14 and in order that the average depth of the surface 16A of the amorphous layer 16 is at least 20 nm from the semiconductor wafer surface 10A.

The following describes heat treatment in the present embodiment. The extent of damage to the semiconductor wafer crystal due to cluster ion irradiation is small compared to that due to monomer ion implantation. Therefore, in one embodiment, the semiconductor epitaxial wafer 100 having high gettering ability can be efficiently produced by performing the first step and then transferring the semiconductor wafer to an epitaxial growth apparatus to carry out the second step without subjecting the semiconductor wafer to heat treatment after the first step to allow recovery of crystallinity. In other words, it is not necessary to perform recovery heat treatment using a rapid heating and cooling heat treatment apparatus such as a rapid thermal annealing (RTA) apparatus or a rapid thermal oxidation (RTO) apparatus that is separate to the epitaxial apparatus. This is because crystallinity of the semiconductor wafer 10 can sufficiently recover during hydrogen baking treatment that is performed in advance of epitaxial growth in the epitaxial apparatus for forming the epitaxial layer 18, which is described further below.

It should be noted that alternatively, recovery heat treatment may of course be performed after the first step and prior to the second step using a heat treatment apparatus that is separate from the epitaxial apparatus. The recovery heat treatment is performed for at least 10 seconds and no greater than 1 hour at no lower than 900° C. and no higher than 1200° C. The recovery heat treatment can for example be performed using a rapid heating and cooling heat treatment apparatus, such as an RTA apparatus or an RTO apparatus, or a batch heat treatment apparatus (vertical heat treatment apparatus or horizontal heat treatment apparatus) before transferring the semiconductor wafer 10 into the epitaxial growth apparatus.

The epitaxial layer 18 formed on the modified layer 14 is for example a silicon epitaxial layer and can be formed under normally used conditions. For example, a source gas such as dichlorosilane or trichlorosilane may be introduced into a chamber using hydrogen as a carrier gas and epitaxial growth may be performed on the semiconductor wafer 10 by CVD at a temperature in range of roughly 1000° C. to 1200° C., although the growth temperature does differ depending on the source gas. The epitaxial layer 18 preferably has a thickness in a range of from 1 μm to 15 μm. A thickness of less than 1 μm may cause a change in resistivity of the epitaxial layer 18 due to outward diffusion of dopant from the semiconductor wafer 10 and a thickness of greater than 15 μm may affect spectral sensitivity characteristics of a solid-state image sensor.

(Semiconductor Epitaxial Wafer)

The following describes the semiconductor epitaxial wafer 100 that is obtained through the production method described above. As illustrated in FIG. 1C, the semiconductor epitaxial wafer 100 includes the semiconductor wafer 10, the modified layer 14 that is located in the surface portion of the semiconductor wafer 10 and that includes a prescribed element in solid solution within the semiconductor wafer 10, and the epitaxial layer 18 located on the modified layer 14. The semiconductor epitaxial wafer 100 according to the present embodiment has high gettering ability.

The modified layer 14 is defined as previously explained and can be identified as a steep peak section in a depth direction concentration profile of the prescribed element that is obtained by performing elemental analysis in the depth direction from the surface 10A of the semiconductor wafer 10 using a secondary ion mass spectrometer (SIMS). The modified layer 14 normally extends from the surface 10A of the semiconductor wafer 10 to a depth in a range of from 50 nm to 400 nm from the surface 10A.

No specific limitations are placed on the prescribed element other than being an element that is not a main material of the semiconductor wafer (i.e., silicon in the case of a silicon wafer). As explained above, the prescribed element is preferably carbon or at least two elements of which one is carbon.

The density of epitaxial defects in the epitaxial layer 18 can be kept to no greater than 0.04 defects/cm² when the average depth of the amorphous layer surface 16A in the modified layer 14, prior to formation of the epitaxial layer 18, is at least 20 nm from the semiconductor wafer surface 10A.

(Solid-State Image Sensor Production Method)

A solid-state image sensor production method according to an embodiment of the present disclosure includes forming a solid-state image sensor in the epitaxial layer 18 at the surface of the semiconductor epitaxial wafer 100 produced by the production method described above. The solid-state image sensor obtained through this production method can more sufficiently suppress occurrence of white spot defects than conventionally.

EXAMPLES

An n type silicon wafer (diameter: 300 mm, thickness: 725 μm, dopant: phosphorus, dopant concentration: 5.0× $10^{14}$ atoms/cm³) was prepared from a CZ monocrystalline silicon ingot. Next, a cluster ion generating apparatus (model: CLARIS, produced by Nissin Ion Equipment Co., Ltd.) was used to generate $C_3H_5$ clusters from cyclohexane and irradiate the surface of the silicon wafer therewith to form a modified layer. The substrate temperature and carbon dose in this irradiation were set to the conditions shown in Table 1. The acceleration voltage per one carbon atom was 23.4 keV/atom, the beam current was 800 μA, the tilt angle was 0°, and the twist angle was 0°.

A cross-section around the modified layer was observed using a TEM straight after cluster ion irradiation. The presence or absence of an amorphous layer in each experimental example, and also the average surface depth and thickness thereof, are shown in Table 1. No. 5 and No. 7 in Table 1 are respectively illustrated in FIGS. 2A and 2B as representative examples. Moreover, No. 13 and No. 14 are respectively illustrated in FIGS. 3A and 3B. In the drawings, an amorphous layer is indicated by white sections. The presence of an amorphous layer was not confirmed in FIG. 2A. In contrast, although the presence of a clear amorphous layer was not confirmed in FIG. 2B, a difference in shading contrast was confirmed compared to FIG. 2A, and this is thought to be due to damage caused by cluster ion irradiation. On the other hand, as clearly illustrated in FIGS. 3A and 3B, the presence of an amorphous layer was confirmed in each of No. 13 and No. 14, which had a larger dose than No. 5 and No. 7. The amorphous layer in FIG. 3A had an average surface depth of 50 nm and a thickness of TO nm, whereas the amorphous layer in FIG. 3B had an average surface depth of 20 nm and a thickness of 60 nm. In other words, it was confirmed that the amorphous layer thickness was increased by changing the substrate temperature from 25° C. to −30° C.

Concentration profiles of carbon and hydrogen for each of the silicon wafers were measured by SIMS. A modified layer could be identified by confirming the presence of a steep peak within a range of approximately 200 nm from the silicon wafer surface. The thickness of the modified layer in each of the experimental examples is shown in Table 1.

Next, each of the silicon wafers was transferred into a single wafer epitaxial growth apparatus (produced by Applied Materials, Inc.) and was subjected to hydrogen baking treatment in the apparatus for 30 seconds at a temperature of 1120° C. Thereafter, a silicon epitaxial layer (thickness: 8 μm, dopant: phosphorous, dopant concentration: $1.0 \times 10^{15}$ atoms/cm³) was epitaxially grown on the modified layer of the silicon wafer by CVD at 1150° C. using hydrogen as a carrier gas and trichlorosilane as a source gas. A silicon epitaxial wafer was obtained as a result.

<Evaluation of Gettering Ability>

The surface of the silicon epitaxial wafer produced in each of the experimental examples was deliberately contaminated by a spin coating contamination method using a Ni contaminant liquid ($1.0 \times 10^{13}$/cm²) and was then subjected to heat treatment for 30 minutes at 900° C. Thereafter, the amount of captured Ni in the modified layer (integrated value of Ni profile) was measured by SIMS. The results are shown in Table 1.

TABLE 1

| No. | Classification | Cluster ion irradiation conditions | | Amorphous layer | | | SIMS measurement | Amount of captured Ni (atoms/cm³) |
| --- | --- | --- | --- | --- | --- | --- | --- | --- |
| | | Substrate temperature | Carbon dose (atoms/cm²) | Presence (yes/no) | Average surface depth (nm) | Thickness (nm) | Modified layer thickness (nm) | |
| 1 | Comparative example | 25° C. | $1 \times 10^{14}$ | No | — | — | 200 | $1.2 \times 10^{12}$ |
| 2 | Example | 0° C. | | No | — | — | 198 | $2.0 \times 10^{12}$ |
| 3 | Example | −30° C. | | No | — | — | 196 | $3.1 \times 10^{12}$ |
| 4 | Example | −120° C. | | No | — | — | 192 | $6.5 \times 10^{12}$ |
| 5 | Comparative example | 25° C. | $5 \times 10^{14}$ | No | — | — | 200 | $4.8 \times 10^{12}$ |
| 6 | Example | 0° C. | | No | — | — | 198 | $6.9 \times 10^{12}$ |
| 7 | Example | −30° C. | | Yes | — | — | 196 | $7.1 \times 10^{12}$ |
| 8 | Example | −120° C. | | Yes | 65 | 5 | 192 | $8.7 \times 10^{12}$ |
| 9 | Comparative example | 25° C. | $1 \times 10^{15}$ | Yes | 60 | 1 | 200 | $7.3 \times 10^{12}$ |
| 10 | Example | 0° C. | | Yes | 60 | 10 | 198 | $9.6 \times 10^{12}$ |
| 11 | Example | −30° C. | | Yes | 55 | 18 | 196 | $9.7 \times 10^{12}$ |
| 12 | Example | −120° C. | | Yes | 40 | 20 | 192 | $9.8 \times 10^{12}$ |
| 13 | Comparative example | 25° C. | $2 \times 10^{15}$ | Yes | 50 | 10 | 200 | $8.5 \times 10^{12}$ |
| 14 | Example | −30° C. | | Yes | 20 | 60 | 196 | $9.6 \times 10^{12}$ |
| 15 | Comparative example | 25° C. | $5 \times 10^{15}$ | Yes | 30 | 40 | 200 | $9.1 \times 10^{12}$ |
| 16 | Example | −30° C. | | Yes | 5 | 75 | 196 | $9.6 \times 10^{12}$ |

Through comparison of results for the same dose, it can be clearly seen from Table 1 that it was possible to achieve higher gettering ability by adopting a substrate temperature that was lower than room temperature in the first step. Moreover, among the "Examples", it was possible to achieve higher gettering ability in instances in which an amorphous layer was formed in the modified layer. This higher getting ability is thought to be due to a region of the amorphous layer recrystallizing after epitaxial layer formation and then also contributing as a gettering site.

The surface of the epitaxial layer of the silicon epitaxial wafer produced in each of the experimental examples was measured by a Surfscan SP1 (produced by KLA-Tencor Corporation) in normal mode and among defects counted as LPDs of at least 90 nm, each defect counted as an LPD-N was defined as an epitaxial defect. With the exception of Comparative Example No. 15 in which approximately 0.04 epitaxial defects/cm² were observed and Example No. 16 in which approximately 0.28 epitaxial defects/cm² were observed, epitaxial defects were not observed in any of the other experimental examples.

INDUSTRIAL APPLICABILITY

According to the present disclosure, it is possible to provide a method of producing a semiconductor epitaxial wafer having enhanced gettering ability.

REFERENCE SIGNS LIST 100 semiconductor epitaxial wafer
10 semiconductor wafer
10A semiconductor wafer surface
12 cluster ion
14 modified layer
16 amorphous layer
16A surface at semiconductor wafer surface-side of amorphous layer
18 epitaxial layer

The invention claimed is:

1. A method of producing a semiconductor epitaxial wafer, comprising:
   irradiating a surface of a semiconductor wafer with cluster ions comprising carbon as a constituent element to form a modified layer that is located in a surface portion of the semiconductor wafer and that includes the constituent element of the cluster ions in solid solution, the modified layer functioning as a gettering site; and
   forming an epitaxial layer on the modified layer of the semiconductor wafer,
   wherein the irradiating with cluster ions is performed in a state in which a temperature of the semiconductor wafer is maintained at lower than 25° C.

2. The method of producing a semiconductor epitaxial wafer of claim 1, wherein the irradiating with cluster ions is performed in a state in which the temperature of the semiconductor wafer is maintained at no higher than 0° C.

3. The method of producing a semiconductor epitaxial wafer of claim 1, wherein the irradiating with cluster ions is performed in a state in which the temperature of the semiconductor wafer is maintained at no lower than −200° C.

4. The method of producing a semiconductor epitaxial wafer of claim 1, wherein the irradiating with cluster ions is performed under conditions such that a portion of the modified layer in terms of a thickness direction becomes an amorphous layer.

5. The method of producing a semiconductor epitaxial wafer of claim 4, wherein the irradiating with cluster ions is performed under conditions such that an average depth of an amorphous layer surface at a semiconductor wafer surface-side of the amorphous layer is at least 20 nm from the surface of the semiconductor wafer.

6. The method of producing a semiconductor epitaxial wafer of claim 1, wherein the cluster ions include at least two elements as constituent elements of which one is carbon.

7. The method of producing a semiconductor epitaxial wafer of claim 1, wherein the cluster ions have a carbon number of no greater than 16.

8. The method of producing a semiconductor epitaxial wafer of claim 1, wherein a carbon dose in the irradiating with cluster ions is $1\times10^{13}$ atoms/cm$^2$ to $5\times10^{15}$ atoms/cm$^2$.

9. A method of producing a solid-state image sensor, comprising forming a solid-state image sensor in the epitaxial layer of the semiconductor epitaxial wafer produced by the producing method of claim 1.

10. The method of producing a semiconductor epitaxial wafer of claim 1, wherein the irradiating with cluster ions is performed in a state in which the temperature of the semiconductor wafer is maintained at no higher than 0° C. and no lower than −120° C.

* * * * *